United States Patent
Doi et al.

(10) Patent No.: US 8,084,364 B2
(45) Date of Patent: Dec. 27, 2011

(54) METHOD OF FABRICATING SEMICONDUCTOR DEVICE

(75) Inventors: Shunsuke Doi, Yokkaichi (JP); Atsushi Shigeta, Yokkaichi (JP)

(73) Assignee: Kabushiki Kaisha Toshiba, Tokyo (JP)

(*) Notice: Subject to any disclaimer, the term of this patent is extended or adjusted under 35 U.S.C. 154(b) by 284 days.

(21) Appl. No.: 12/501,690

(22) Filed: Jul. 13, 2009

(65) Prior Publication Data

US 2010/0015777 A1 Jan. 21, 2010

(30) Foreign Application Priority Data

Jul. 15, 2008 (JP) .................. 2008-184082

(51) Int. Cl.
*H01L 21/302* (2006.01)
(52) U.S. Cl. .............................. 438/693; 257/E21.304
(58) Field of Classification Search .................. 438/692, 438/693; 257/E21.304
See application file for complete search history.

(56) References Cited

U.S. PATENT DOCUMENTS

| 6,626,968 | B2 | 9/2003 | Park et al. |
| 2006/0246723 | A1 | 11/2006 | Park et al. |
| 2007/0284338 | A1 | 12/2007 | Matsui et al. |

FOREIGN PATENT DOCUMENTS

| JP | 2003-273207 | 9/2003 |
| JP | 2007-288217 | 11/2007 |
| JP | 2007-329342 | 12/2007 |
| JP | 2008-098239 | 4/2008 |
| KR | 10-2004-0062406 | 7/2004 |

OTHER PUBLICATIONS

U.S. Appl. No. 12/956,591, filed Nov. 30, 2010, Fujita, et al.
Office Action issued Jan. 27, 2011, in Korean Patent Application No. 10-2009-63330 (with English-language Translation).

*Primary Examiner* — Kimberly Nguyen
*Assistant Examiner* — Amar Movva
(74) *Attorney, Agent, or Firm* — Oblon, Spivak, McClelland, Maier & Neustadt, L.L.P.

(57) ABSTRACT

A method of fabricating a semiconductor device, includes forming an amorphous silicon film above a semiconductor substrate, partially removing the amorphous silicon film and partially removing the semiconductor substrate, thereby forming an element isolation trench in a surface of the semiconductor substrate, forming an insulating film above the amorphous silicon film so that the element isolation trench is filled with the insulating film, polishing the insulating film by a chemical-mechanical polishing method with the amorphous silicon film serving as a stopper, thereby planarizing an upper surface of the insulating film, and thermally-treating the amorphous silicon film, thereby converting the amorphous silicon film to a polysilicon film after polishing the insulating film.

20 Claims, 5 Drawing Sheets

US 8,084,364 B2

METHOD OF FABRICATING SEMICONDUCTOR DEVICE

CROSS-REFERENCE TO RELATED APPLICATIONS

This application is based on and claims the benefit of priority from the prior Japanese Patent Application No. 2008-184082, filed on Jul. 15, 2008, the entire contents of which are incorporated herein by reference.

BACKGROUND

1. Field

The present invention relates to a method of fabricating a semiconductor device, and more particularly to a chemical-mechanical polishing used in forming a shallow trench isolation (STI) structure.

2. Related Art

Japanese patent application publication JP-A-2007-329342 discloses a conventional chemical mechanical polishing used in forming an STI structure. A nitride film is employed as a stopper film in the disclosed chemical mechanical polishing. A selectivity or a removal rate ratio of an insulating film for filling a trench in the STI structure to a nitride film ($SiO_2$/SiN) is at some level when the nitride film is used as a stopper in polishing the insulating film. However, polishing places a large load on an isolation pattern of the stopper film. As a result, there is a problem that an amount of stopper film removed in the isolation pattern is larger than in the other patterns. Furthermore, a pattern line width of wiring has been reduced with progress in structural refinement in the semiconductor fabrication process. This necessitates a reduction in the film thickness of the stopper film, and there is a problem that the nitride film has a definite limitation in the use as a stopper film.

SUMMARY

According to one aspect of the present invention, there is provided a method of fabricating a semiconductor device, comprising forming an amorphous silicon film above a semiconductor substrate, partially removing the amorphous silicon film and partially removing the semiconductor substrate, thereby forming an element isolation trench in a surface of the semiconductor substrate, forming an insulating film above the amorphous silicon film so that the element isolation trench is filled with the insulating film, polishing the insulating film by a chemical-mechanical polishing method with the amorphous silicon film serving as a stopper, thereby planarizing an upper surface of the insulating film, and thermally-treating the amorphous silicon film, thereby converting the amorphous silicon film to a polysilicon film after polishing the insulating film.

According to another aspect of the present invention, there is provided a method of fabricating a semiconductor device, comprising forming a gate insulating film for a plurality of memory cells so that a semiconductor substrate is covered by the gate insulating film, forming an amorphous silicon film above the gate insulating film, partially removing the amorphous silicon film, partially removing the gate insulating film and partially removing the semiconductor substrate, thereby forming a plurality of element isolation trenches in a surface of the semiconductor substrate, forming a silicon oxide film above the amorphous silicon film so that the element isolation trenches are filled with the silicon oxide film, and polishing the silicon oxide film by a chemical-mechanical polishing method with the amorphous silicon film serving as a stopper, thereby planarizing an upper surface of the silicon oxide film.

DETAILED DESCRIPTION

A first embodiment will be described with reference to FIGS. 1A to 1E. FIGS. 1A to 1E show sequential steps of the semiconductor device fabricating method in accordance with the first embodiment. The figures each show a part of a flash memory related to the forming of STI structure in a memory cell region, as an example.

Figure 1A:
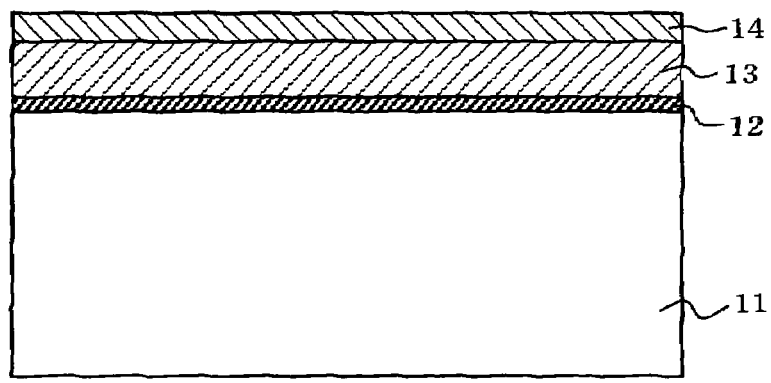
FIGS. 1A to 1E are sectional views of a semiconductor device in sequential steps of a semiconductor device fabricating method in accordance with a first embodiment.

The semiconductor device fabricating method includes a depositing step, a trench forming step, a filling step, a polishing step and a thermal treating step. A gate oxide film 12, a polysilicon film 13 and an amorphous silicon film 14 are sequentially formed on a silicon substrate 11 so that a surface of the silicon substrate 11 is covered by the films, in the depositing step, as shown in FIG. 1A. More specifically, firstly, the gate oxide film 12 serving as a gate insulating film of memory cells is formed on a surface of the silicon substrate 11, for example, by thermal oxidation. Next, polysilicon is deposited on the gate oxide film 12 to be formed into the polysilicon film 13 which will further be formed into a floating gate. Amorphous silicon is subsequently deposited on the polysilicon film 13 to be formed into the amorphous silicon film 14 serving as a stopper film in chemical-mechanical polishing. A removal rate ratio of the insulating film for element isolation to amorphous silicon ($SiO_2$/a-Si) in a chemical-mechanical polishing is higher than a removal rate ratio of an insulating film to a nitride film ($SiO_2$/SiN). As a result, a film thickness of the amorphous silicon film 14 can be reduced as compared with the conventionally used silicon nitride film.

Figure 1B:
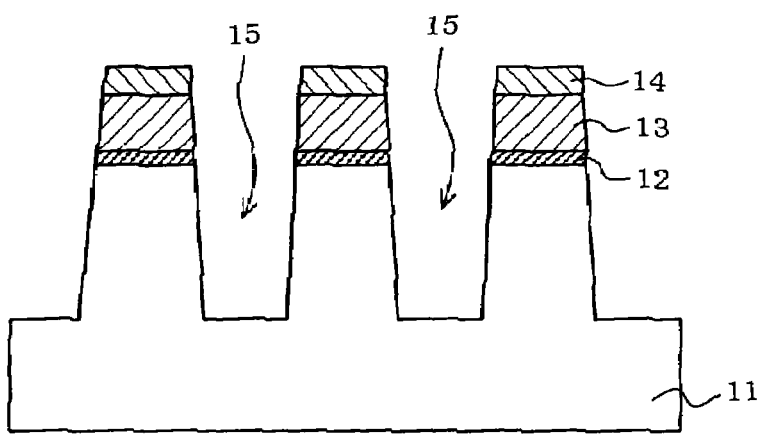

A plurality of element isolation trenches 15 is formed in the trench forming step as shown in FIG. 1B. The element isolation trenches 15 are used for forming an STI structure which isolates the memory cells one from the others. More specifically, each of the amorphous silicon film 14 (the stopper film), the polysilicon film 13 and the gate oxide film 12 is partially removed by an ordinary photolithography technique. A part of the semiconductor substrate 11 located near the surface thereof is also removed by the photolithography technique simultaneously with the amorphous silicon film 14, the polysilicon film 13 and the gate oxide film 12. As a result, the element isolation trenches 15 are formed in a surface layer of the silicon substrate 11.

Figure 1C:
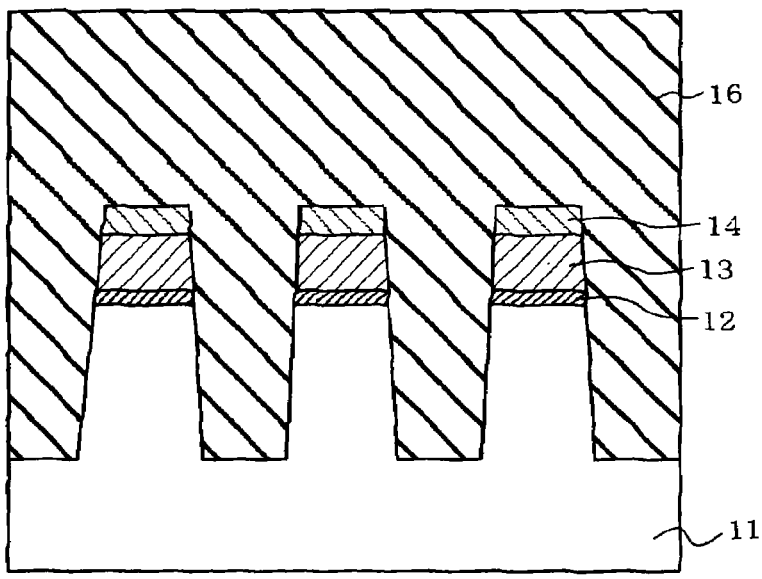
Figure 1D:
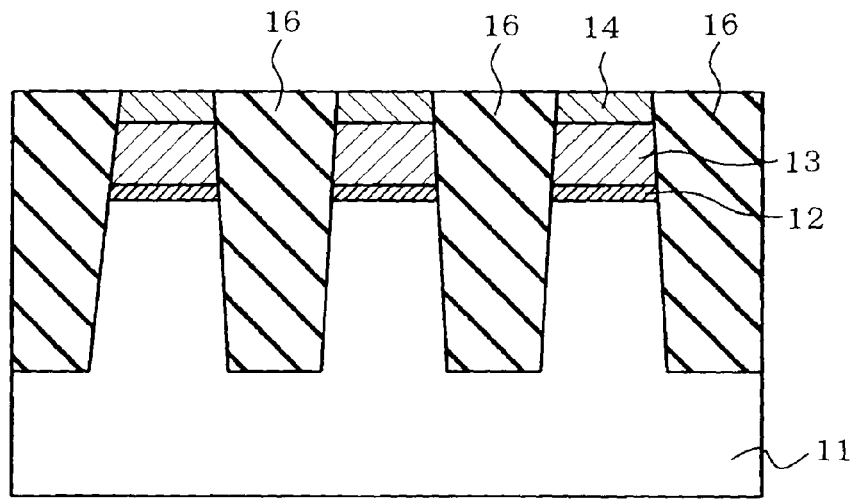

An insulating film such as a silicon oxide film is deposited on an entire surface of the silicon substrate 11 in the filling step so that an insulating film 16 is formed so as to fill the element isolation trenches 15, as shown in FIG. 1C. The insulating film 16 formed in the filling step is polished by a chemical-mechanical polishing in the polishing step as shown in FIG. 1D. In this case, the insulating film 16 is polished so as to reach the level of the amorphous silicon film 14 (the stopper film) remaining as the result of treatment in the trench forming step. A removal rate ratio of the insulating film 16 to the amorphous silicon film 14 (SiO$_2$/a-Si) in the chemical-mechanical polishing is about four times higher than a removal rate ratio of the insulating film to the nitride film (SiO$_2$/SiN). Accordingly, an endpoint detection with the use of torque current can easily be carried out, and an over-polishing time can be rendered shorter. Consequently, a removed film thickness of the amorphous silicon film 14 can be rendered smaller, and in particular, a removed film thickness of the amorphous silicon film 14 in the use with an isolation pattern can be reduced.

Figure 1E:
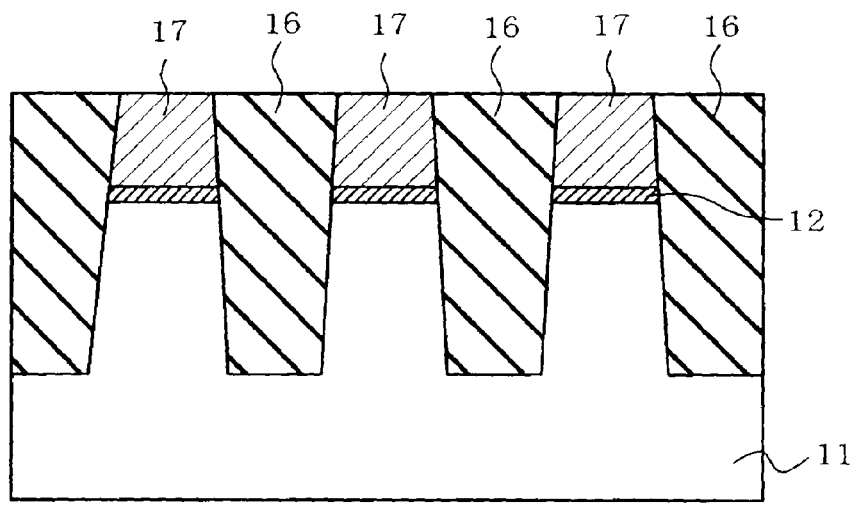

The amorphous silicon film 14 remaining after the polishing step is thermally treated in the thermal treatment step thereby to be converted into a polysilicon film, as shown in FIG. 1E. The converted polysilicon film is used to form floating gates 17 together with the polysilicon film 13. This can eliminate a step of removing the amorphous silicon film 14 or the stopper film remaining after the polishing step.

According to the first embodiment, the removal rate ratio of the insulating film 16 to the amorphous silicon film 14 (SiO$_2$/a-Si) serving as the stopper film in the chemical-mechanical polishing is about four times higher than the removal rate ratio of the insulating film to the nitride film (SiO$_2$/SiN). Accordingly, the film thickness of the stopper film removed in the polishing step can be reduced, and in particular, the film thickness of the stopper film removed in the isolation pattern can be reduced. Consequently, a high fabrication yield can be realized.

Furthermore, the film thickness of the amorphous silicon film 14 is rendered smaller as compared with the nitride film (SiN) serving as the conventional stopper film. Consequently, an aspect ratio in the trench forming step can be rendered smaller as compared with conventional aspect ratios, and the STI structure can readily be formed.

Furthermore, since the remaining amorphous silicon film 14 is converted into the polysilicon film in the thermal treatment step, the amorphous silicon film 14 remaining after the polishing step need not be removed but can be used as the floating gates 17 together with the lower-layer polysilicon film 13. Consequently, the time of the fabrication process can be shortened and the fabrication costs can be reduced accordingly.

FIGS. 2A to 2E illustrate a second embodiment and show sequential steps of the semiconductor device fabricating method in accordance with the second embodiment. The figures show a part of a flash memory related to the forming of STI structure in a memory cell region, as an example.

Figure 2A:
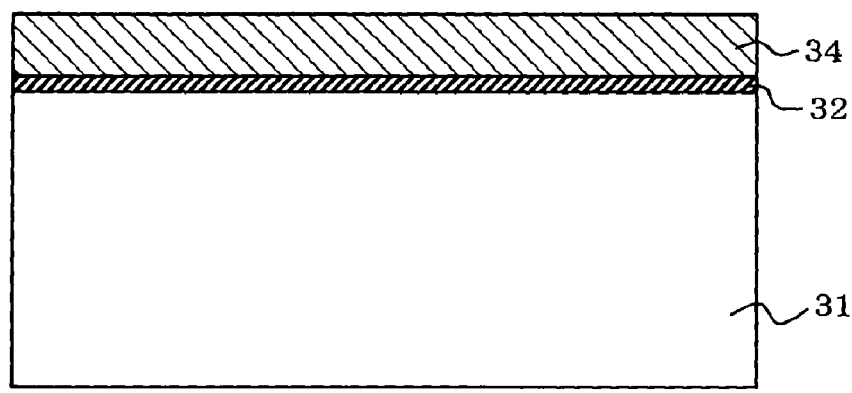
FIGS. 2A to 2E are sectional views of a semiconductor device in sequential steps of a semiconductor device fabricating method in accordance with a second embodiment.

The semiconductor device fabricating method includes a depositing step, a trench forming step, a filling step, a polishing step and a thermal treating step. A gate oxide film 32 and an amorphous silicon film 34 are in turn formed on a silicon substrate 31 so that a surface of the silicon substrate 31 is covered by the films, in the depositing step, as shown in FIG. 2A. More specifically, firstly, the gate oxide film 32 for memory cells is formed on a surface of the silicon substrate 11, for example, by thermal oxidation. Next, amorphous silicon is deposited on the gate oxide film 32 to be formed into the amorphous silicon film 34.

N-type impurities such as phosphor (P) are introduced into the amorphous silicon film 34 during or after the film forming. A film-forming temperature is set to about 550° C., for example. The amorphous silicon film 34 is converted to polysilicon in the thermal treating step which will be described later. Accordingly, the amorphous silicon is deposited so that the film thickness thereof necessary at least for the floating gate is ensured. The amorphous silicon film 34 is also used as the stopper film in the chemical-mechanical polishing in the polishing step. The amorphous silicon film 34 is thermally treated at a temperature ranging from 900° C. to 1000° C. for a predetermined time for the purpose of activation of the impurities.

Figure 2B:
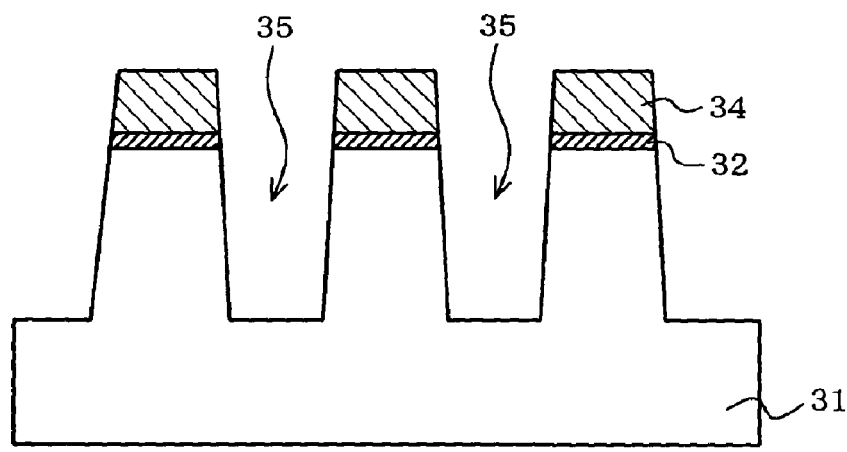

A plurality of element isolation trenches 35 is formed in the trench forming step as shown in FIG. 2B. The element isolation trenches 35 are used for forming an STI structure which isolates the memory cells one from the others. More specifically, each of the amorphous silicon film 34 (the stopper film) and the gate oxide film 32 is partially removed by an ordinary photolithography technique and a reactive ion etching (RIE) process. A part of the semiconductor substrate 11 located near the surface thereof is also removed by the ordinary photolithography technique and the RIE process simultaneously with the amorphous silicon film 34 and the gate oxide film 32. As a result, the element isolation trenches 35 are formed in a surface layer of the silicon substrate 31.

Figure 2C:
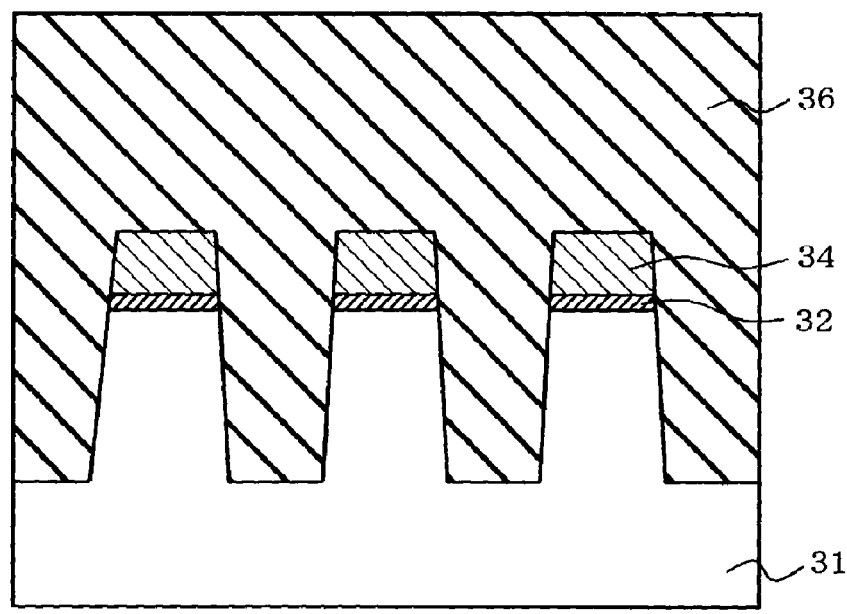

A silicon oxide film, for example, is deposited on an entire surface of the silicon substrate 31 in the filling step so that an insulating film 36 is formed so as to fill the element isolation trenches 35, as shown in FIG. 2C. In this case, the silicon oxide film serving as the insulating film 36 is formed by applying a coating film such as polysilazane having a good filling characteristic and thereafter converting the coating film into a silicon oxide film by a thermal treatment or the like. Alternatively, the silicon oxide film is formed by a thermal chemical vapor deposition (CVD) method. A thermal treatment at the temperature of about 950° C. is carried out in the step of converting the polysilazane into the silicon oxide film.

Since the structure is formed through the above-described step, the previously formed amorphous silicon film 34 has slightly been crystallized from an amorphous state by the activation of impurities as a thermal step, the thermal treatment during the forming of the insulating film 36 or the like. In this case, it is desirable that the amorphous silicon film 34 has a grain size that is controlled so as not to be more than 150 nm, or more desirably so as not to be more than 100 nm, even after progress in crystallization in order that the amorphous silicon film 34 may function as a satisfactory stopper film. On the other hand, it is more desirable that the grain size of the amorphous silicon film 34 is controlled so as not to be less than 50 nm in consideration of a satisfactory abradability suppressing occurrence of scratch or the like. The grain size of the amorphous silicon film 34 can easily be measured by film cross-section observation using a transmission electron microscope (TEM).

Figure 2D:
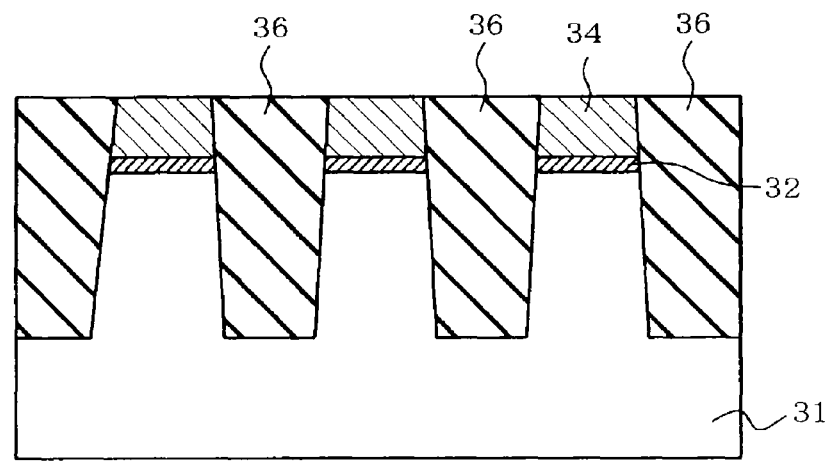

In the polishing step, the insulating film 36 formed in the filling step is polished by the chemical-mechanical polishing so as to be at the level of the amorphous silicon film 34 (the stopper film) remaining after the trench forming step, as shown in FIG. 2D. In this case, ceria (cerium oxide CeO$_2$) such as DLS-2 (manufactured by Hitachi Chemical Company Ltd., Tokyo, Japan) is used as polishing particles in a polishing step. Furthermore, ammonium polyacrylate such as TK-75 (manufactured by Kao Corporation, Tokyo, Japan) that is an anion surfactant is used as a dispersing agent.

The removal rate ratio of the insulating film 36 to the amorphous silicon film 34 (SiO$_2$/a-Si) serving as the stopper film in the chemical-mechanical polishing is about four times higher than the removal rate ratio of the insulating film to the nitride film (SiO$_2$/SiN) even when the conventional polishing apparatus and polishing pad are used. Accordingly, the film thickness of the amorphous silicon film 34 removed in the polishing step can be reduced, and in particular, the film thickness of the amorphous silicon film 34 removed in the isolation pattern can be suppressed. Furthermore, since the amorphous silicon film 34 has a film thickness corresponding at least to the floating gate of the memory cell, dissipation of isolation pattern and the like can be suppressed in the chemical-mechanical polishing.

Figure 2E:
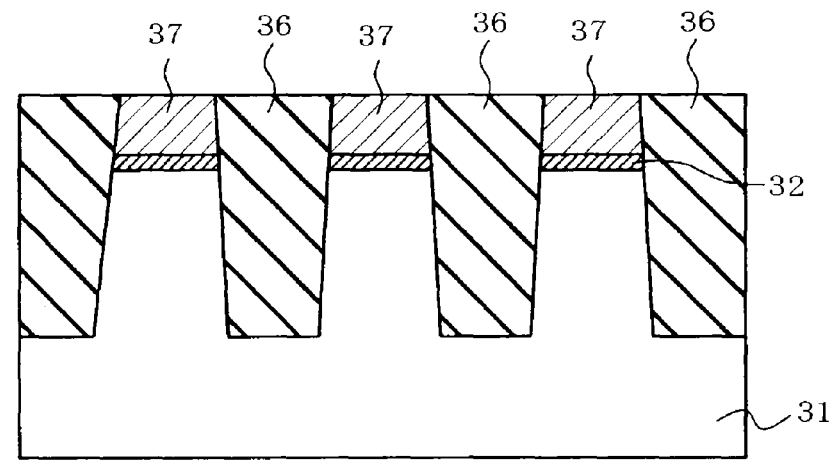

The amorphous silicon film 34 remaining after the polishing step is thermally treated in the thermal treatment step thereby to be converted into polysilicon, as shown in FIG. 2E. The converted polysilicon is used to form floating gates 37 of the memory cells. This can eliminate a step of removing the amorphous silicon film 34 remaining after the polishing step.

According to the second embodiment, the removal rate ratio of the insulating film 36 to the amorphous silicon film 34 ($SiO_2$/a-Si) serving as the stopper film in the chemical-mechanical polishing is about four times higher than the removal rate ratio of the insulating film to the nitride film ($SiO_2$/SiN). Accordingly, the film thickness of the stopper film removed in the polishing step can be reduced, and in particular, the film thickness of the stopper film removed in the isolation pattern can be reduced. Consequently, a high fabrication yield can be realized.

Furthermore, when amorphous silicon is crystallized through the thermal treatment before the polishing step after film formation of the amorphous silicon film 34, the amorphous silicon film 34 has a crystal grain size that is controlled so as not to be more than 150 nm. Accordingly, the amorphous silicon film 34 can be used as a satisfactory stopper film maintaining the higher removal rate ratio of the insulating film 36 thereto than the conventional silicon nitride films. Furthermore, the effect of suppressing occurrence of scratch in the polishing step can further be improved when the grain size of the amorphous silicon film 34 is controlled so as not to be less than 50 nm.

Furthermore, since the amorphous silicon film 34 has a film thickness corresponding at least to the floating gate of the memory cell, dissipation of the stopper film in the region of the isolation pattern can be suppressed in the chemical-mechanical polishing. Consequently, a high fabrication yield can be realized.

Furthermore, the amorphous silicon film 34 remaining after the polishing step is converted into the polysilicon film in the thermal treatment step thereby to be used as the floating gate 37. Accordingly, the amorphous silicon film 34 remaining after the polishing step need not be removed, whereupon the fabrication process can be shortened and the fabrication costs can be reduced accordingly.

Figure 3:
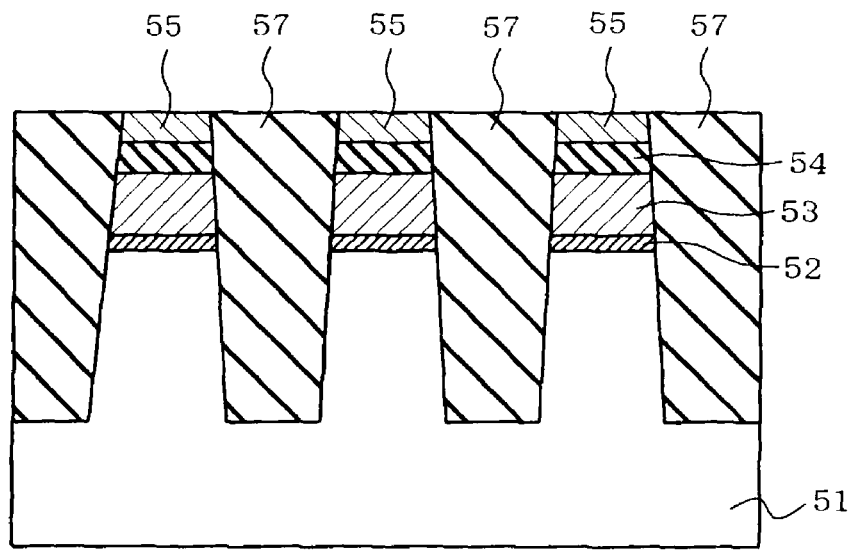
FIG. 3 is a sectional view of a semiconductor device in a polishing step of the semiconductor device fabricating method in accordance with a third embodiment.

FIG. 3 is a sectional view of the semiconductor device after the polishing step of the semiconductor device fabricating method in accordance with a third embodiment.

The semiconductor device fabricating method includes a depositing step, a trench forming step, a filling step, a polishing step and a thermal treating step. Differences between the second and third embodiments will be described in the following.

In the depositing step, a gate oxide film 52 is formed so as to cover the surface of the semiconductor substrate 51, and a polysilicon film 53, a silicon nitride film 54 and an amorphous silicon film 55 are sequentially formed on the gate oxide film 52, as shown in FIG. 3. More specifically, firstly, the gate oxide film 52 for memory cells is formed on the surface of the silicon substrate 11, for example, by thermal oxidation. Next, polysilicon is deposited on the gate oxide film 52 to be formed into the polysilicon film 53 which is to serve as a floating gate. A silicon nitride film (SiN) 54 is formed on the polysilicon film 53. Amorphous silicon is then deposited on the silicon nitride film 54 to be formed into an amorphous silicon film 55 serving as the stopper film in the chemical-mechanical polishing.

The removal rate ratio of the insulating film 57 to the amorphous silicon film 55 ($SiO_2$/a-Si) serving as the stopper film in the chemical-mechanical polishing is about four times higher than the removal rate ratio of the insulating film to the silicon nitride film conventionally used as the stopper film ($SiO_2$/SiN). Accordingly, the film thickness of the amorphous silicon film 55 removed in the polishing step can be reduced. Furthermore, the silicon nitride film 54 formed under the amorphous silicon film 55 serves as an etching stopper in etch removal of the amorphous silicon film 55 and is not a stopper in the chemical-mechanical polishing. Accordingly, the film thickness of the silicon nitride film 54 can be reduced.

The trench forming, filling and polishing steps are then carried out in the same manner as in the second embodiment. In the polishing step, the insulating film 57 is polished with the amorphous silicon film 55 serving as a stopper thereby to be planarized as shown in FIG. 3. Subsequently, the amorphous silicon film 55 and the silicon nitride film 54 are selectively etch-removed in turn such that the polysilicon film 53 can be formed into the floating gate electrode.

According to the third embodiment, the amorphous silicon film 55 is formed above the polysilicon film 53 with the silicon nitride film 54 being interposed therebetween. In this case, the removal rate ratio of the insulating film 57 to the amorphous silicon film 55 ($SiO_2$/a-Si) serving as the stopper film in the chemical-mechanical polishing is about four times higher than the removal rate ratio of the insulating film to the nitride film ($SiO_2$/SiN). Accordingly, the film thickness of the stopper film removed in the polishing step can be rendered smaller. Furthermore, since the amorphous silicon film 55 and the silicon nitride film 54 are selectively removable, the floating gate electrode can be avoided from being adversely affected by scratch even if the scratch should occur in the stopper film in the polishing process.

The chemical-mechanical polishing in the forming of STI in the memory cell region of the flash memory has been exemplified in the first to third embodiments. However, the method can be applied to any step in which the chemical-mechanical polishing is carried out such as element isolation in a usual MOS transistor or planarization of an insulating film.

The foregoing description and drawings are merely illustrative of the principles and are not to be construed in a limiting sense. Various changes and modifications will become apparent to those of ordinary skill in the art. All such changes and modifications are seen to fall within the scope as defined by the appended claims.

What is claimed is:

1. A method of fabricating a semiconductor device, comprising:
    forming an amorphous silicon film above a semiconductor substrate;
    partially removing the amorphous silicon film and partially removing the semiconductor substrate, thereby forming an element isolation trench in a surface of the semiconductor substrate;
    forming an insulating film above the amorphous silicon film so that the element isolation trench is filled with the insulating film;
    polishing the insulating film by a chemical-mechanical polishing method with the amorphous silicon film serving as a stopper, thereby planarizing an upper surface of the insulating film; and
    thermally-treating the amorphous silicon film, thereby converting the amorphous silicon film to a polysilicon film after polishing the insulating film.

2. The method according to claim 1, wherein before the forming of the amorphous silicon film, a gate oxide film is formed on the semiconductor substrate, and the amorphous silicon film is formed so as to cover the gate oxide film.

3. The method according to claim 1, wherein before the forming of the amorphous silicon film, a gate oxide film is formed on the semiconductor substrate, a bottom polysilicon film is formed so as to cover the gate oxide film, and the amorphous silicon film is formed so as to cover the bottom polysilicon film.

4. The method according to claim 2, wherein the polysilicon film obtained by thermally-treating the amorphous silicon film serves as a gate electrode.

5. The method according to claim 2, wherein in the chemical-mechanical polishing, the amorphous silicon film has a grain size of not more than 150 nm.

6. The method according to claim 5, wherein in the chemical-mechanical polishing, the amorphous silicon film has a grain size of not less than 50 nm.

7. The method according to claim 2, wherein in the forming of the amorphous silicon film, an impurity is added to the amorphous silicon film and a thermal treatment is carried out after film formation.

8. The method according to claim 2, wherein in the forming of the insulating film, a coating film is applied above the amorphous silicon film and thermally treated thereby to be formed into the insulating film.

9. The method according to claim 8, wherein the coating film includes a polysilazane film.

10. The method according to claim 2, wherein in the forming of the insulating film, a thermal chemical vapor deposition oxide film is formed as the insulating film.

11. The method according to claim 2, wherein in the chemical-mechanical polishing, ceria ($CeO_2$) is used as polishing particles.

12. The method according to claim 11, wherein in the chemical-mechanical polishing, an anion surfactant is used as a dispersing agent.

13. The method according to claim 12, wherein the anion surfactant includes ammonium polyacrylate.

14. A method of fabricating a semiconductor device, comprising:
    forming a gate insulating film for a plurality of memory cells so that a semiconductor substrate is covered by the gate insulating film;
    forming an amorphous silicon film above the gate insulating film;
    partially removing the amorphous silicon film, partially removing the gate insulating film and partially removing the semiconductor substrate, thereby forming a plurality of element isolation trenches in a surface of the semiconductor substrate;
    forming a silicon oxide film above the amorphous silicon film so that the element isolation trenches are filled with the silicon oxide film; and
    polishing the silicon oxide film by a chemical-mechanical polishing method with the amorphous silicon film serving as a stopper, thereby planarizing an upper surface of the silicon oxide film.

15. The method according to claim 14, wherein after planarization of the upper surface of the silicon oxide film, the amorphous silicon film is thermally treated thereby to be converted into a polysilicon film serving as a floating gate.

16. The method according to claim 14, wherein in the chemical-mechanical polishing, the amorphous silicon film has a grain size of not more than 150 nm.

17. The method according to claim 16, wherein in the chemical-mechanical polishing, the amorphous silicon film has a grain size of not less than 50 nm.

18. The method according to claim 14, wherein in the forming of the amorphous silicon film, an impurity is added to the amorphous silicon film and a thermal treatment is carried out after film formation.

19. The method according to claim 14, wherein in the chemical-mechanical polishing, ceria ($CeO_2$) is used as polishing particles.

20. The method according to claim 19, wherein in the chemical-mechanical polishing, an anion surfactant is used as a dispersing agent.

* * * * *